US012100429B2

(12) United States Patent
Lin et al.

(10) Patent No.: US 12,100,429 B2
(45) Date of Patent: Sep. 24, 2024

(54) METHODS AND SYSTEMS FOR CONTROLLING THERMAL PERFORMANCE AND VIBRATION PERFORMANCE OF HARD DISK DRIVES

(71) Applicant: ZT GROUP INT'L, INC., Secaucus, NJ (US)

(72) Inventors: Ting Yu Lin, Fairfield, NJ (US); David Anthony Berardi, Helmetta, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 466 days.

(21) Appl. No.: 17/475,680

(22) Filed: Sep. 15, 2021

(65) Prior Publication Data

US 2023/0080462 A1 Mar. 16, 2023

(51) Int. Cl.
*G11B 33/14* (2006.01)
*G06F 11/30* (2006.01)
*G06F 11/34* (2006.01)
*H05K 7/20* (2006.01)

(52) U.S. Cl.
CPC ........ *G11B 33/142* (2013.01); *G06F 11/3034* (2013.01); *G06F 11/3058* (2013.01); *G06F 11/3409* (2013.01); *G11B 33/144* (2013.01); *H05K 7/20136* (2013.01); *H05K 7/20209* (2013.01)

(58) Field of Classification Search
None
See application file for complete search history.

(56) References Cited

U.S. PATENT DOCUMENTS

| | | | |
|---|---|---|---|
| 8,845,299 B1 * | 9/2014 | Hughes | F04D 27/004 417/42 |
| 2013/0258521 A1 * | 10/2013 | Yang et al. | G11B 33/144 360/97.13 |
| 2013/0317657 A1 * | 11/2013 | Mundt et al. | G11B 33/08 700/280 |
| 2014/0277818 A1 * | 9/2014 | Peterson et al. | G06F 1/206 700/300 |
| 2017/0329598 A1 * | 11/2017 | Hobson et al. | G06F 1/206 |
| 2017/0336839 A1 * | 11/2017 | Ho et al. | G06F 1/206 |
| 2019/0155348 A1 * | 5/2019 | Lu | G06F 1/206 |
| 2019/0361508 A1 * | 11/2019 | Yarragunta et al. | F04D 27/004 |
| 2021/0329813 A1 * | 10/2021 | Shabbir et al. | G06F 1/206 |

* cited by examiner

*Primary Examiner* — Craig A. Renner
(74) *Attorney, Agent, or Firm* — POLSINELLI PC

(57) ABSTRACT

A computer-implemented method is provided for cooling hard disk drives (HDDs). The method may include determining a threshold fan speed for one or more fans that provide cooling for HDDs based upon a target HDD vibration performance. The method may also include controlling the one or more fans, by a controller, to alternately run at a first fan speed for a first period and at the threshold fan speed for a second period, when the one or more fans reach the threshold fan speed. The first fan speed is higher than the threshold fan speed.

20 Claims, 4 Drawing Sheets

METHODS AND SYSTEMS FOR CONTROLLING THERMAL PERFORMANCE AND VIBRATION PERFORMANCE OF HARD DISK DRIVES

FIELD

The disclosure is directed to methods and systems for controlling fans to cool hard disk drives at vibration safe speeds.

BACKGROUND

High-performance computing servers are energy-intensive and densely configured, which produces more heat in smaller spaces in a data center. As the rack density for servers increases, the data center may need more efficient and effective cooling technologies.

Just a Bunch of Disks or Drives (JBOD) is a storage architecture including many hard disk drives (HDDs) inside a single storage enclosure. There remains a need for a system and a method to manage cooling fans in servers or JBOD.

BRIEF SUMMARY

In one aspect, a computer-implemented method may include determining a threshold fan speed for one or more fans that provide cooling for hard disk drives (HDDs) based upon a target HDD vibration performance. The method may also include controlling the one or more fans, by a controller, to alternately run at a first fan speed for a first period and at the threshold fan speed for a second period, when the one or more fans reach the threshold fan speed. The first fan speed is higher than the threshold fan speed. The method may also include controlling the one or more fans, by the controller, to increase fan speed, when the one or more fans are below the threshold fan speed. For example, the controller determines a threshold fan speed for one or more fans that provide cools for HDDs based upon a target HDD vibration performance; controls the one or more fans, by a controller, to alternately run at a first fan speed for a first period and at the threshold fan speed for a second period, when the one or more fans reach the threshold fan speed. The first fan speed is higher than the threshold fan speed.

In another aspect, a controller is provided that includes a storage device (e.g., a memory configured to store data, such as virtual content data, one or more images, etc.) and one or more processors (e.g., implemented in circuitry) coupled to the memory and configured to execute instructions and, in conjunction with various components (e.g., a display, an output device, etc.), cause the controller to determine a threshold fan speed for one or more fans that provide cool for HDDs based upon a target HDD vibration performance, and to control the one or more fans to alternately run at a first fan speed for a first period and at the threshold fan speed for a second period, when the one or more fans reach the threshold fan speed. The first fan speed is higher than the threshold fan speed.

In a further aspect, a non-transitory computer-readable medium may include instructions, the instructions, when executed by a computing system, cause the computing system to determine a threshold fan speed for one or more fans that provide cool for hard disk drives (HDDs) based upon a target HDD vibration performance. The non-transitory computer-readable medium may include instructions, the instructions, when executed by a computing system, cause the computing system to control the one or more fans to alternately run at a first fan speed for a first period and at the threshold fan speed for a second period, when the one or more fans reach the threshold fan speed. The first fan speed is higher than the threshold fan speed.

Additional embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Fans are used for cooling HDDs in servers. A conventional fan speed control methodology is to continuously keep the fan speed the same if there is no component temperature change. There is usually a threshold fan speed above which a predetermined target HDD vibration performance cannot be achieved. However, a high fan speed may be needed for cooling either at high ambient temperature or high component loading.

When the fan speed increases, the performance of the HDDs in servers or JBOD may drop due to vibration issues of the fan. The vibration may also be referred to as rotational vibration, acoustic vibration, or mechanical vibration, as the vibration relates to the rotation of the fan, which generates mechanical noises that travel in the air. The vibration from the server's cooling fans may affect the throughput performance of the HDDs. This usually occurs at higher fan speed, which may be represented by revolutions per minute (RPM).

The disclosure provides an alternating fan speed control algorithm that can reduce vibration impact and increase HDD performance while improving the cooling power of the fans. The alternating fan speed control algorithm takes consideration of both a thermal specification and a vibration performance specification for HDDs. The alternating fan speed control algorithm may reduce the fan speed to a vibration safe fan speed to meet the vibration performance specification for HDDs, while alternately increasing the fan speed to a fan speed above the vibration safe fan speed, which may be needed to meet the thermal specification for HDDs.

The fans may be pulse width modulation (PWM) fans, which are often used for cooling the HDDs. The PWM fan speed is often represented by fan duty cycles. PWM works like a switch, turning on and off the fans while controlling the level of power delivered to the fans. PWM fans work with motors, receiving full power or zero power. For example, PWM fans may have a duty cycle of 100% at which the fan is in full power. PWM fans may have a duty cycle of 95% at which the fan has lower power than the duty cycle of 100%. Likewise, the PWM fans may have a duty cycle of 90%, 85%, etc., among others.

Figure 1:
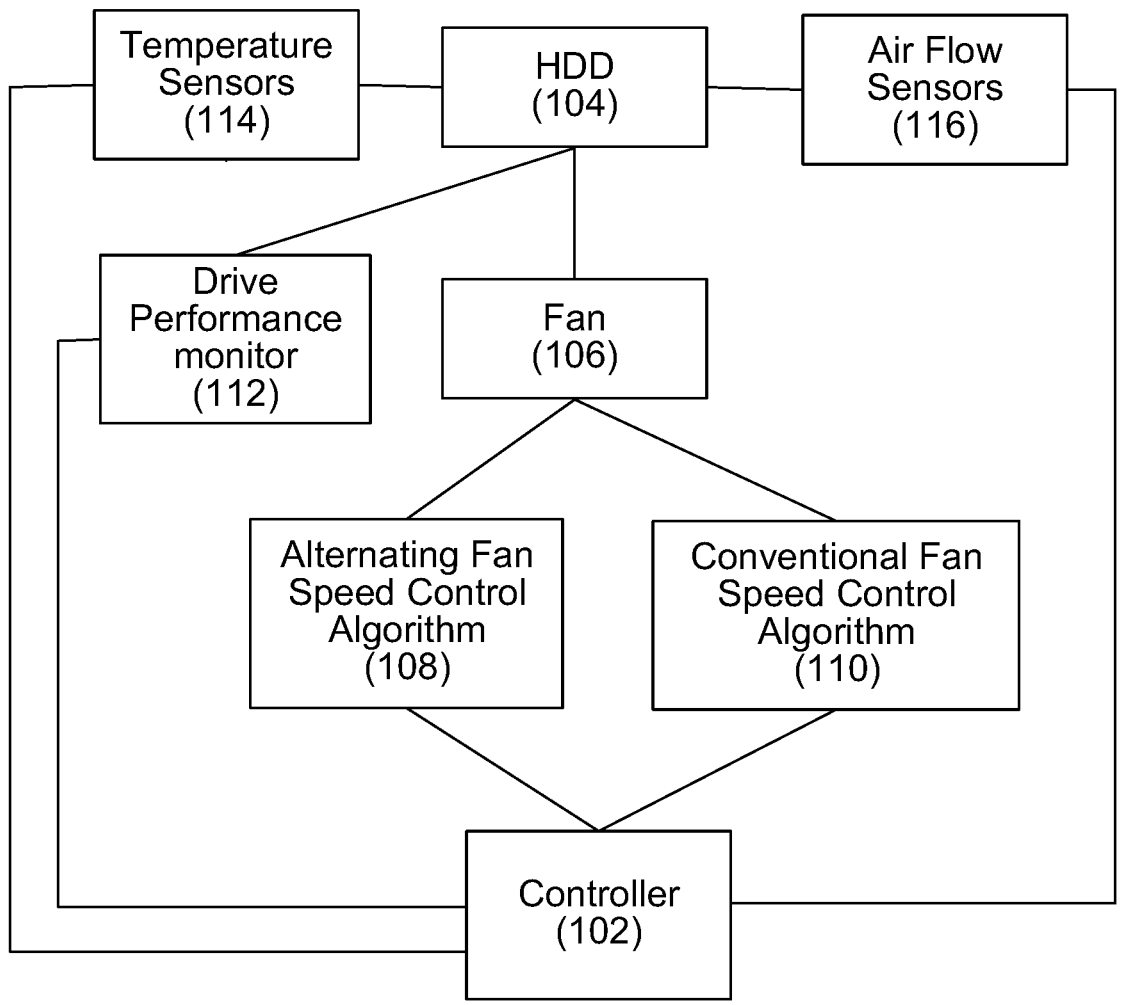
FIG. 1 is a system diagram illustrating a controller for fan speed control in accordance with an embodiment of the disclosure.

FIG. 1 is a system diagram illustrating a controller for fan speed control in accordance with an embodiment of the disclosure. As shown, a system 100 includes a controller 102, HDDs 104, and fans 106 for cooling the HDDs 104. The controller 102 may control the speed of one or more fans 106. In some embodiments, the fans 106 may be PWM fans.

System 100 may also include a performance monitor 112 for monitoring the performance of the HDDs 104, for example, input and output operations per second (IOPS). The performance monitor 112 is in electrical communication with controller 102. IOPS is a measurement of performance for HDDs and storage area networks. IOPS represents how quickly a given storage device or medium can read and write commands per second. The drive performance monitors 112 are in electrical communication with the controller 102, which may keep track of the drive performance of each HDDs during the operation of the HDDs.

A threshold fan speed or PWM can be set as a vibration safe fan speed, at which a vibration performance specification cannot be met if the fans continuously run at the threshold fan speed. Also, the HDD cannot meet the vibration performance specification if the fan is running above the threshold fan speed continuously. When the fan speed reaches the threshold fan speed or PWM, controller 102 can use the alternating PWM algorithm 108 to increase the fan speed to meet the thermal specification. The controller 102 can also use the alternating PWM algorithm 108 to keep the vibration within the vibration performance specification while increasing the cooling power of the fans 106.

The vibration performance specification may be defined as the HDD IOPS at the vibration safe fan speed being less than a performance threshold (e.g. 5%) from a baseline IOPS, which does not have any influence of the JBOD fans on the HDDs. If the performance drop from the baseline IOPS is greater than the performance threshold, for example, 5%, the HDD is considered to meet the vibration performance specification.

System 100 may also include an alternating fan speed control algorithm 108 for controlling the speed of the fan 106. The alternating fan speed control algorithm 108 controls the fan speed to keep the HDDs in a good performance. The alternating fan speed control algorithm 108 periodically reduces the fan speed to lower vibration or periodically increases the fan speed to achieve thermal performance for the HDDs. By controlling the rotational speed of the fans 106, adequate cooling can be provided to the HDDs 104 in a JBOD. The alternating fan speed control algorithm 108 balances the cooling capacities and noise generation or vibration of the fans.

The alternating fan speed control algorithm 108 controls the fan 106 to have brief excursions of fan speed higher than the threshold fan speed. The alternating fan speed control algorithm 108 would allow more cooling of the HDDs than a conventional fan speed control algorithm 110, while the excursions at the fan speed higher than the threshold fan speed would not be long enough to cause failures of the target vibration performance specification, which is predetermined.

System 100 may also include the conventional fan speed control algorithm 110 for controlling the fan 106 to continuously run at a fan speed lower than the threshold fan speed. The conventional fan speed control algorithm 110 can be any existing fan speed control algorithm. The alternating fan speed control algorithm 108 can be combined with the conventional fan speed control algorithm 110.

System 100 may also include temperature sensors 114 placed within the HDDs for monitoring the temperature of the HDDs 104. The sensors 114 may be digital temperature sensors. The temperature sensors 114 are in electrical communication with the controller 102, which may keep track of the ambient temperature during the operation of the HDDs.

System 100 may also include airflow sensors 116 for monitoring airflow near the HDDs. The airflow is affected by the fan speed and the locations of the HDDs in servers or JBOD. The airflow sensors 116 are in electrical communication with the controller 102, which may keep track of the airflow during the operation of the HDDs.

The thermal specification may define the ambient temperature range of the HDDs. For example, the thermal specification may define the maximum temperature of the HDDs defined by the manufacturer. The temperature of the HDDs may be read through internal digital temperature sensors within the HDDs or read at a specific point on the HDD case. The temperature of the HDDs needs to be below the maximum temperature. The thermal specification may also define the airflow near the HDDs in JBOD. The thermal specification may be predetermined based upon the thermal performance of the HDDs. The thermal performance of the HDDs 104 may vary with the workload of the HDDs. The thermal performance of the HDDs may also vary with the airflow created by the fans. The thermal performance of the HDDs may also be affected by the time at a fan speed exceeding the threshold fan speed. The time exceeding the threshold fan speed may be short enough not to cause HDDs to overheat. The thermal performance may further vary with the ambient temperature.

Figure 2:
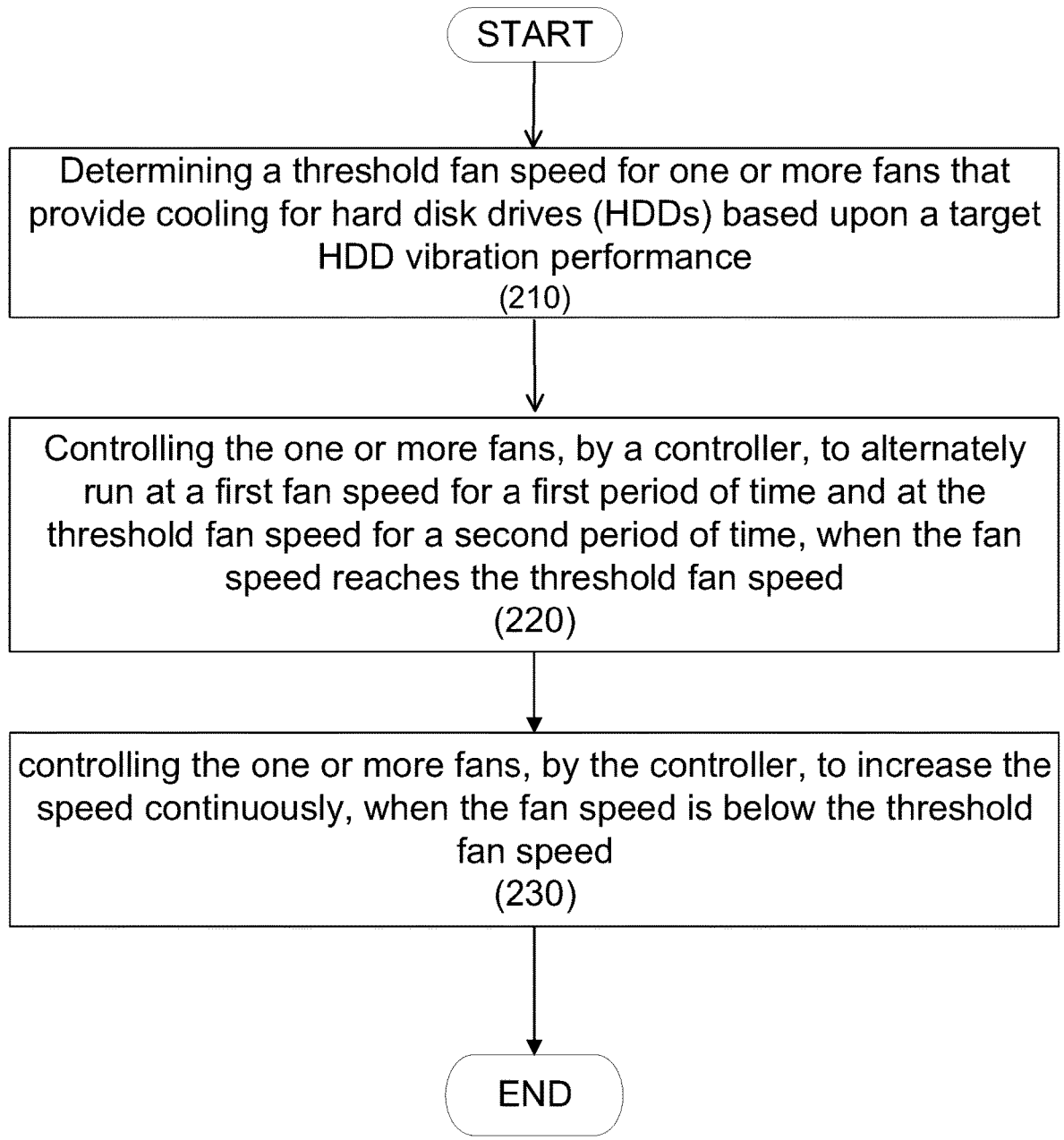
FIG. 2 is a flow chart illustrating the method of controlling the fan speed for hard disk drives (HDDs) in accordance with an embodiment of the disclosure.

FIG. 2 is a flow chart illustrating the method of controlling the fan speed for HDDs in accordance with embodiments of the disclosure. Although example method 200 depicts a particular sequence of operations, the sequence may be altered without departing from the scope of the present disclosure. For example, some of the operations depicted may be performed in parallel or in a different sequence that does not materially affect the function of the method 200. In other examples, different components of an example device or system that implements method 200 may perform functions at substantially the same time or in a specific sequence.

According to some examples, method 200 may include determining a threshold fan speed for one or more fans that provide cooling for hard disk drives (HDDs) based upon a target HDD vibration performance at block 210. For example, the controller 102 illustrated in FIG. 1 may determine a threshold fan speed for one or more fans that provide cool for hard disk drives (HDDs) based upon a target HDD vibration performance.

In some embodiments, the threshold fan speed depends upon the workload of the HDDs.

In some embodiments, the HDDs are housed in a chassis.

According to some examples, method 200 may include controlling the one or more fans to alternately run at a first fan speed for a first period and at the threshold fan speed for a second period, when the fan speed reaches the threshold fan speed at block 220. For example, the controller 102 illustrated in FIG. 1 may control the one or more fans to alternately run at a first fan speed for a first period and at the threshold fan speed for a second period, when the fan speed reaches the threshold fan speed. The first fan speed is higher than the threshold fan speed. The first fan speed is higher than the threshold fan speed.

In some embodiments, the first period equals the second period.

In some embodiments, the first period is different from the second period.

According to some examples, method 200 may include controlling one or more fans to increase fan speed, when the fan speed is below the threshold fan speed at block 230. For example, controller 102 illustrated in FIG. 1 may further control one or more fans to increase fan speed, when the fan speed is below the threshold fan speed.

According to some examples, method 200 may include recording a baseline IOPS without one or more fans for cooling the HDDs. For example, controller 102 illustrated in FIG. 1 may record a baseline input or output operation per second (IOPS) without one or more fans for cooling the HDDs.

According to some examples, method 200 may include determining if HDD performance drops a performance threshold from the baseline IOPS. For example, controller 102 illustrated in FIG. 1 may determine if the HDD performance drops a performance threshold from the baseline IOPS.

In some embodiments, the HDD performance is considered a failure if the performance drop is greater than the performance threshold.

In some embodiments, the performance threshold is 5%.

In some embodiments, the thermal performance includes airflow and ambient temperature near the HDDs.

According to some examples, method 200 may include monitoring the thermal performance of the HDDs. For example, temperature sensor 114 illustrated in FIG. 1 may monitor the temperature near the HDDs and is in electrical communication with the controller.

According to some examples, method 200 may include monitoring the thermal performance of the HDDs. For example, the airflow sensor 116 illustrated in FIG. 1 may monitor the airflow near the HDDs and is in electrical communication with the controller.

According to some examples, method 200 may include monitoring the HDD performance of the HDDs. For example, the drive performance monitor 112 illustrated in FIG. 1 may monitor the HDD performance of the HDDs and is in electrical communication with the controller.

In some embodiments, the first fan speed, the first period, and the second period are selected to control vibrations caused by one or more fans and to avoid overheat of the hard disk drives (HDDs) to meet a target HDD performance in IOPS.

EXAMPLE

The following examples are for illustration purposes only. It will be apparent to those skilled in the art that many modifications, both to materials and methods, may be practiced without departing from the scope of the disclosure.

Figure 3:
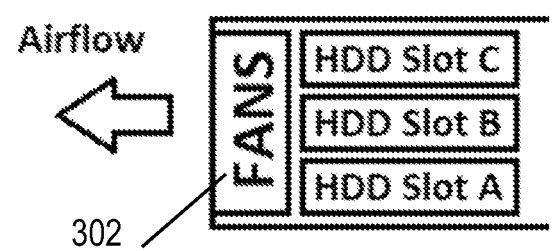
FIG. 3 is a diagram illustrating configuration of a fan with a few HDDs in accordance with an embodiment of the disclosure.

A number of HDDs were placed in a JBOD or chassis with fans for cooling the JBOD or chassis. The HDDs were at different distances from the fans. FIG. 3 is a diagram illustrating configuration of a fan with a few HDDs in accordance with an embodiment of the disclosure. As shown in FIG. 3, a fan 302 is positioned next to a stack of three HDD slots A, B, and C, where slot A is at the bottom of the stack, slot C is at the top of the stack, and slot B is in a middle between slot A and slot C. Three HDDs A, B, and C were placed in the corresponding slots A, B, and C during testing, i.e. HDD A in HDD slot A, HDD B in HDD slot B, and HDD C in HDD slot C. These three HDDs were the closest to the fan. The performances of these three HDDs were mostly affected by the fans.

Rotational vibration testing was performed on HDDs in the JBOD while stressing the HDDs with a workload of 128 KB Sequential Writes, queue depth=8. While all HDDs in the JBOD were stressed, the three HDDs closest to the fans (slots designated as A, B, and C) were the HDDs of interest, because the performance of the HDDs A, B, and C were impacted by the fans in the JBOD.

Tests were performed on the HDDs with fans cooling at different speeds or without fans. In a first rotational vibration testing, a baseline IOPS was recorded without the influence of the JBOD fans on the HDDs.

In a second rotational vibration testing, the fans continuously ran at a speed (e.g. 95% and 100% duty cycles for PWM fans), which was controlled by the controller 102 using the fan speed control algorithm 110. The IOPS was recorded for each speed for each HDD.

In a third rotational vibration testing, the fans ran at two alternating speeds for a period at each speed (e.g. 95% and 100% for PWM fans), which was controlled by the controller 102 using the alternating fan speed control algorithm 108. The IOPS was recorded for each HDD.

Results are presented in Tables 1 and 2. Table 1 shows the results for fans running continuously at a single speed. Table 2 shows the results for fans alternately running at two speeds, at each speed for a period. For example, the fans alternately ran at 100% PWM for a first period (e.g. 10 seconds) and then run at 95% PWM for a second period (e.g. 10 seconds).

The power for PWM fans may be expressed in a percentage of on-time versus off-time. The 95% PWM means that the fan power is on 95% of the time and off 5% of the time. The 100% means that the fan power is on 100% of the time. Note that % PWM is used as an interchangeable term with "duty cycle" here.

In some variations, PWM is a method of controlling the fan speed and power, and 95% duty cycle (used interchangeably with 95% PWM here) refers to fan power on 95% of the time and off 5% of the time. The following fans speeds were used for the tests, e.g. 95% duty cycle=14100 revolutions per minute (RPM) and 100% duty cycle=14900 RPM.

As shown in Table 1, the HDDs met the vibration performance specification at fan speeds 95% PWM, which is a vibration safe speed. However, the HDDs failed the vibration performance specification at fan speeds 100% PWM, which is above the vibration safe speed of 95% PWM. In both cases (i.e. 95% PWM and 100% PWM), the fans ran continuously at the speed.

As an example, the vibration performance specification requires a performance threshold of 5%. The HDD A had a performance drop of 6.4%, which exceeded the performance threshold of 5%. The HDD B had a performance drop of 4.5%, which was also within the performance threshold of 5%. The HDD C had a performance drop of 7.3%, which exceeded the performance threshold of 5%. As such, HDDs A and C were considered to fail the vibration performance specification.

TABLE 1

Results for fans running at a continuous speed

| System HDD Slot | Baseline IOPS | 95% PWM IOPS | Performance drop at 95% PWM | 100% PWM IOPS | Performance drop at 100% PWM |
|---|---|---|---|---|---|
| A | 1106 | 1107 | −0.1% | 1035 | 6.4% |
| B | 1107 | 1106 | 0.1% | 1057 | 4.5% |
| C | 1106 | 1090 | 1.4% | 1025 | 7.3% |

However, as shown in Table 2, when the fan speed was alternating between 95% PWM and 100% PWM, for 10 seconds at each speed, the HDDs were able to meet the vibration performance specification, e.g. a performance threshold of 5% for HDDs. Specifically, HDD A had a performance drop of 4.4%, which was within the performance threshold of 5%. HDD B had a performance drop of 1.8%, which was also within the performance threshold of 5%. HDD C had a performance drop of 4.8%, which was still within the performance threshold of 5%.

TABLE 2

Results for fans running at two alternating speeds

| System HDD Slot | Baseline IOPS | 95% PWM IOPS | Performance drop at 95% PWM IOPS | PWM alternating between 95% and 100%, 10 seconds each | Performance drop for oscillating PWM |
|---|---|---|---|---|---|
| A | 1106 | 1107 | −0.1% | 1057 | 4.4% |
| B | 1107 | 1106 | 0.1% | 1087 | 1.8% |
| C | 1106 | 1090 | 1.4% | 1053 | 4.8% |

It will be appreciated by those skilled in the art that the performance threshold may vary. In some variations, the performance threshold may be 10%. In some variations, the performance threshold may be 9%. In some variations, the performance threshold may be 8%. In some variations, the performance threshold may be 7%. In some variations, the performance threshold may be 6%. In some variations, the performance threshold may be 5%. In some variations, the performance threshold may be 4%.

Also, compared to continuously running the fans at 95% PWM, the alternating fan speed control algorithm 108 allows more cooling power and thus more capability to keep the HDDs within the thermal specification. Further, compared to running the fans continuously at 100% PWM, the alternating fan speed control algorithm 108 allows power saving.

Figure 4:
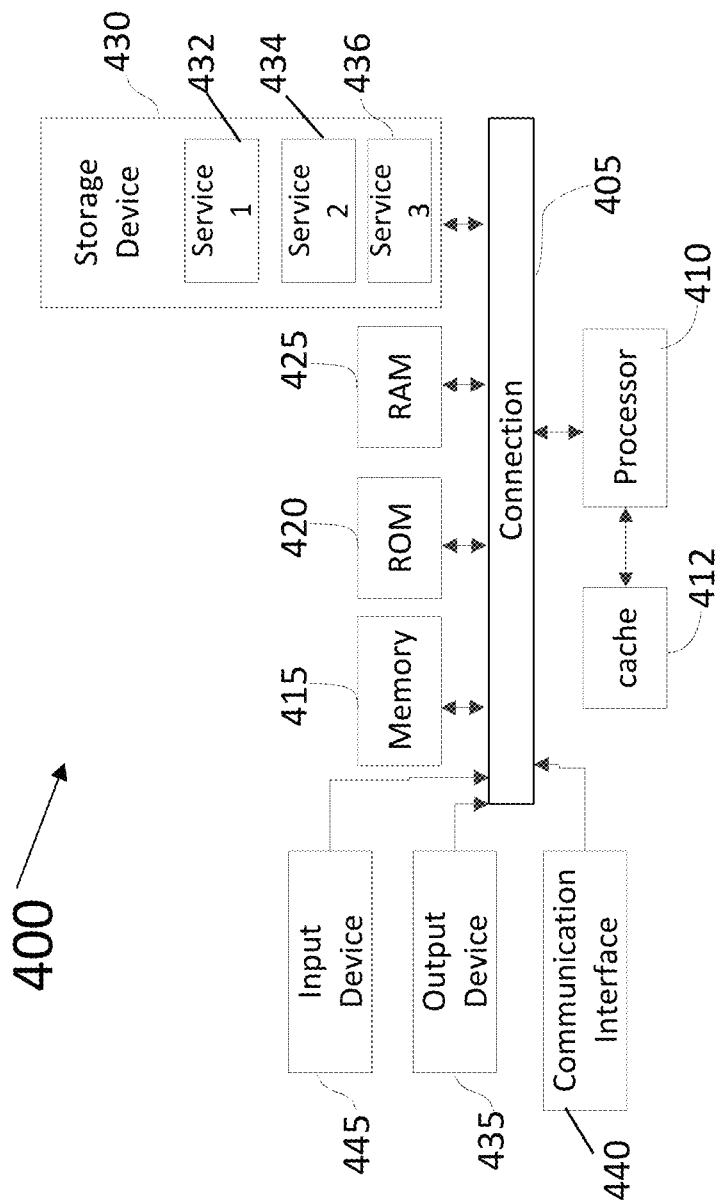
FIG. 4 shows an example of a system for implementing certain aspects of the present technology.

FIG. 4 shows an example of computing system 400, which can be for example any computing device making up the controller 102 or any component thereof in which the components of the system are in communication with each other using connection 405. Connection 405 can be a physical connection via a bus, or a direct connection into processor 410, such as in a chipset architecture. Connection 405 can also be a virtual connection, networked connection, or logical connection.

In some embodiments, computing system 400 is a distributed system in which the functions described in this disclosure can be distributed within a data center, multiple data centers, a peer network, etc. In some embodiments, one or more of the described system components represents many such components each performing some or all of the function for which the component is described. In some embodiments, the components can be physical or virtual devices.

Example system 400 includes at least one processing unit (CPU or processor) 410 and connection 405 that couples various system components including system memory 415, such as read-only memory (ROM) 420 and random access memory (RAM) 425 to processor 410. Computing system 400 can include a cache of high-speed memory 412 connected directly with, close to, or integrated as part of processor 410.

Processor 410 can include any general-purpose processor and a hardware service or software service, such as services 432, 434, and 436 stored in storage device 430, configured to control processor 410 as well as a special-purpose processor where software instructions are incorporated into the actual processor design. Processor 410 may essentially be a completely self-contained computing system, containing multiple cores or processors, a bus, memory controller, cache, etc. A multi-core processor may be symmetric or asymmetric.

To enable user interaction, computing system 400 includes an input device 445, which can represent any number of input mechanisms, such as a microphone for speech, a touch-sensitive screen for gesture or graphical input, keyboard, mouse, motion input, speech, etc. Computing system 400 can also include output device 435, which can be one or more of many output mechanisms known to those of skill in the art. In some instances, multimodal systems can enable a user to provide multiple types of input/output to communicate with computing system 400. Computing system 400 can include communications interface 440, which can generally govern and manage the user input and system output. There is no restriction on operating on any particular hardware arrangement, and therefore the basic features here may easily be substituted for improved hardware or firmware arrangements as they are developed.

Storage device 430 can be a non-volatile memory device and can be a hard disk or other types of computer-readable media which can store data that are accessible by a computer, such as magnetic cassettes, flash memory cards, solid-state memory devices, digital versatile disks, cartridges, random access memories (RAMs), read-only memory (ROM), and/or some combination of these devices.

The storage device 430 can include software services, servers, services, etc., that when the code that defines such software is executed by the processor 410, it causes the system to perform a function. In some embodiments, a hardware service that performs a particular function can include the software component stored in a computer-readable medium in connection with the necessary hardware components, such as processor 410, connection 405, output device 435, etc., to carry out the function.

For clarity of explanation, in some instances, the present technology may be presented as including individual functional blocks including devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bitstream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can include, for example, instructions and data which cause or otherwise configure a general-purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can include hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall therebetween.

What is claimed is:

1. A computer-implemented method to control cooling and vibrations, the method comprising:
    determining a threshold fan speed for one or more fans that provide cooling for hard disk drives (HDDs) based upon a target HDD vibration performance; and
    controlling the one or more fans, by a controller, to alternately run at a first fan speed for a first period and at the threshold fan speed for a second period, when the one or more fans reach the threshold fan speed, wherein the first fan speed is higher than the threshold fan speed to meet both a target thermal specification and the target HDD vibration performance without reducing power usage of the HDDs.

2. The computer-implemented method of claim 1, further comprising controlling the one or more fans, by the controller, to increase fan speed, when the one or more fans are below the threshold fan speed.

3. The computer-implemented method of claim 1, wherein the first fan speed and the first period and the second period are selected to control vibrations caused by one or more fans and to avoid overheat of the hard disk drives (HDDs) to meet a target HDD performance in input/output operation per second (IOPS).

4. The computer-implemented method of claim 1, wherein the one or more fans comprise PWM fans.

5. The computer-implemented method of claim 1, wherein the threshold fan speed depends upon the workload of the HDDs.

6. The computer-implemented method of claim 1, wherein the HDDs are housed in a chassis.

7. The computer-implemented method of claim 1, further comprising:
    recording a baseline input/output operation per second (IOPS) without the one or more fans for cooling the HDDs; and
    determining if HDD performance drops a performance threshold compared to the baseline IOPS.

8. The computer-implemented method of claim 1, further comprising monitoring thermal performance of the HDDs by one or more temperature sensors and one or more airflow sensors in electrical communication with the controller.

9. The computer-implemented method of claim 1, further comprising monitoring HDD performance of the HDDs by a drive performance monitor in electrical communication with the controller.

10. A system comprising:
    a storage device configured to store instructions; and
    a processor configured to execute the instructions and cause the processor to:
    determine a threshold fan speed for one or more fans that provide cooling for hard disk drives (HDDs) based upon a target HDD vibration performance; and
    control the one or more fans to alternately run at a first fan speed for a first period and at the threshold fan speed for a second period when the one or more fans reach the threshold fan speed, wherein the first fan speed is higher than the threshold fan speed to meet both a target thermal specification and the target HDD vibration performance without reducing power usage of the HDDs.

11. The system of claim 10, wherein the processor is configured to execute the instructions and cause the processor to control the one or more fans to increase the fan speed when the one or more fans are below the threshold fan speed.

12. The system of claim 10, wherein the first fan speed, the first period, and the second period are selected to control vibrations caused by one or more fans and to avoid overheat of the hard disk drives (HDDs) to meet a target HDD performance in input/output operation per second (IOPS).

13. The system of claim 10, wherein the one or more fans comprise PWM fans.

14. The system of claim 10, wherein the threshold fan speed depends upon the workload of the HDDs.

15. The system of claim 10, wherein the processor is configured to execute the instructions and cause the processor to:

record a baseline input or output operation per second (IOPS) without one or more fans for cooling the HDDs; and determine if HDD performance drops a performance threshold from the baseline IOPS.

16. The system of claim 10, wherein the processor is configured to execute the instructions and cause the processor to monitor the thermal performance of the HDDs by one or more temperature sensors and one or more airflow sensors in electrical communication with the processor.

17. The system of claim 10, wherein the processor is configured to execute the instructions and cause the processor to monitor HDD performance by a drive performance monitor in electrical communication with the processor.

18. A non-transitory computer-readable medium comprising instructions, the instructions, when executed by a computing system, cause the computing system to:

determine a threshold fan speed for one or more fans that provide cooling for hard disk drives (HDDs) based upon a target HDD vibration performance; and control the one or more fans to alternately run at a first fan speed for a first period and at the threshold fan speed for a second period, when the one or more fans reach the threshold fan speed, wherein the first fan speed is higher than the threshold fan speed to meet both a target thermal specification and the target HDD vibration performance without reducing power usage of the HDDs.

19. The non-transitory computer-readable medium of claim 18, wherein the computer-readable medium further comprises instructions that, when executed by the computing system, cause the computing system to control the one or more fans to increase fan speed, when the one or more fans are below the threshold fan speed.

20. The non-transitory computer-readable medium of claim 18, wherein the first fan speed and the first period and the second period are selected to control vibrations caused by one or more fans and to avoid overheat of the hard disk drives (HDDs) to meet a target HDD performance in input/output operation per second (IOPS).

* * * * *